United States Patent [19]
Suzuki

[11] Patent Number: 6,163,499
[45] Date of Patent: Dec. 19, 2000

[54] PROGRAMMABLE IMPEDANCE OUTPUT BUFFER DRIVERS, SEMICONDUCTOR DEVICES AND STATIC RANDOM ACCESS MEMORIES PROVIDED WITH A PROGRAMMABLE IMPEDANCE OUTPUT PORT

[75] Inventor: Azuma Suzuki, Tokyo, Japan

[73] Assignee: Kabushiki Kaisha Toshiba, Kanagawa-ken, Japan

[21] Appl. No.: 09/461,117

[22] Filed: Dec. 14, 1999

[30] Foreign Application Priority Data

Dec. 14, 1998 [JP] Japan .................................. 10-355097

[51] Int. Cl.$^7$ .................................................. G11C 13/00
[52] U.S. Cl. .................................. 365/230.06; 365/189.05
[58] Field of Search .......................... 365/189.05, 230.06, 365/230.8

[56] References Cited

U.S. PATENT DOCUMENTS 5,631,873  5/1997  Furutani ............................. 365/230.06

OTHER PUBLICATIONS

"A 300MHz,3.3V 1Mb SRAM Fabricated in a 0.5$\mu$m CMOS Process," ISSCC Digest of Technical Papers, pp. 148–149, Feb. 1996.

*Primary Examiner*—Terrell W. Fears
*Attorney, Agent, or Firm*—Banner & Witcoff, Ltd.

[57] ABSTRACT

A semiconductor device is equipped with an improved programmable impedance output buffer driver which makes it possible to adjust the impedance of the output buffer of the semiconductor device to the impedance of the bus lines of the system bus in a normal operation mode and to adjust the impedance of the output buffer of the semiconductor device to a predetermined fixed impedance in a test mode. It is therefore possible to effectively and accurately conduct tests of the semiconductor device.

43 Claims, 16 Drawing Sheets

PROGRAMMABLE IMPEDANCE OUTPUT BUFFER DRIVERS, SEMICONDUCTOR DEVICES AND STATIC RANDOM ACCESS MEMORIES PROVIDED WITH A PROGRAMMABLE IMPEDANCE OUTPUT PORT

CROSS REFERENCE TO RELATED APPLICATIONS

The subject application is related to subject matter disclosed in the Japanese Patent Application No. Hei10-355097 filed in Dec. 14, 1998 in Japan, to which the subject application claims priority under the Paris Convention and which is incorporated by reference herein.

BACKGROUND OF THE INVENTION

1. Field of the Invention

The present invention is related to an improvement of the semiconductor device provided with a programmable impedance output buffer driver for adjusting the impedance of the output buffer of the semiconductor device.

2. Description of the Related Art

In the recent years, along with increasing frequencies of input/output operations in the field of the semiconductor integrated circuits, it becomes increasingly important to avoid matching problems caused between the impedance of an output buffer and the impedance of a transmission line formed on a printed circuit board (PCB).

In the prior art semiconductor devices, however, if there exists a mismatch between the impedance of the bus lines of the system and the impedance of the output buffer of the device which is connected to the bus lines, undesirable reflection waves take place at the interface so that it is impossible to realize high speed data transmission and high speed operation of the system bus due to the reflection waves.

A new technique called the programmable impedance output buffer driver has been proposed, wherein, even if the environment is changed, the impedance of the output buffer can be finely adjusted to an 1/n of the impedance as prepared between a ZQ pad and VSS by a user. Typically, the number n is an integer, for example, five. This technique becomes one of the important circuit techniques for realizing the high speed data transmission.

FIG. 1 is a block diagram showing the circuit configuration of the prior art programmable impedance output buffer driver. An external resistor 50 is connected between the lower power potential level VSS (e.g., the ground potential) and the ZQ pad to which is applied, from the external impedance monitoring load circuit, a half reference potential of the higher power potential (VDDQ) as applied to the output buffer 5. The impedance of a dummy output buffer 2 is adjusted to the impedance of the resistance value RQ of the external resistor 50 by the impedance adjustment control circuit 3.

Thereafter, a data update control circuit 4 outputs an adjustment data of the dummy output buffer 2 to the output buffer 5 in a certain timing so that the impedance of the output buffer 5 is set as the 1/n of said external resistor 50 to update the output impedance.

A sampling clock generating circuit 6 generates sampling clocks for controlling the opening and closing operation of the register of the impedance adjustment control circuit 3 and the data update control circuit 4 in order to supply the sampling clocks to the impedance adjustment control circuit 3 and the data update control circuit 4.

Meanwhile, both the dummy output buffer 2 and the output buffer 5 are composed of a plurality of transistors which are turned on/off in order to change the impedance thereof. Accordingly, the data update control circuit 4 outputs the on/off signals, e.g., four bit signals A0, A1, A2 and A3 (i.e., the adjustment data) for turning on or off the plurality of the transistors of the dummy output buffer 2 in order to adjust the impedance of the output buffer 5.

FIG. 2 is a block diagram showing the exemplary circuits of the external impedance monitoring load circuit 1, the dummy output buffer 2 and the output buffer 5. The information of the resistance value RQ of the external resistor 50 is extracted as the potential level VZQ. In this case, the four bit signals A0, A1, A2 and A3 are adjusted with the high level "1" and the low level "0" in order to adjust the pad potential of the ZQ pad equal to the potential VEVAL so that the resistance value RQ of the external resistor 50 is made equal to the impedance of the dummy output buffer 2.

As described above, the impedance of the output buffer 5 of the programmable impedancne output buffer driver is controlled to maintain the 1/n of the resistance value RQ of the external resistor 50 by updating the four bit signals A1, A1, A2 and A3 in a certain timing by means of the data update control circuit 4. There is a problem, however, that when the programmable impedance output buffer driver can not correctly operate for some reason irrespective of the resistance value RQ of the external resistor 50 maintained at a constant value, resulting in a fluctuating the impedance of the output buffer 5, it is impossible to evaluate the operation speed of devices such as a memory. This tends to affect the efficiency of other test items for this device.

SUMMARY OF THE INVENTION

The present invention has been made in order to solve the shortcomings as described above. It is an object of the present invention to provide a semiconductor device equipped with an improved the programmable impedance output buffer driver which makes it possible to adjust the impedance of the output buffer of the semiconductor device to a predetermined fixed impedance in a test mode, and to effectively and accurately conduct tests of the semiconductor device.

It is another object of the present invention to provide an improved programmable impedance output buffer driver which makes it possible to adjust the impedance of the output buffer of the semiconductor device to a predetermined fixed impedance in a test mode, and to effectively and accurately conduct tests of the semiconductor device.

It is a further object of the present invention to provide an improved static random access memory which makes it possible to adjust the impedance of the output buffer of the semiconductor device to a predetermined fixed impedance in a test mode, and to effectively and accurately conduct operational tests of the semiconductor device.

In brief, the above and other objects and advantages of the present invention are provided by a new and improved semiconductor device having a programmable impedance output port comprising:

a programmable impedance output buffer driver for adjusting the output impedance of said programmable impedance output port to an 1/n of the resistance value of an external resistor;

a mode switching circuit for switching the operation mode of said semiconductor device to a test mode by halting the operation of said programmable impedance output buffer driver in response to potential change of said impedance adjustment pad; and an impedance fixing circuit for fixing, in the test mode, said output impedance of said programmable impedance output port to an fixed value irrespective of the impedance of said external resistor.

Furthermore, in accordance with a preferred embodiment of the present invention, said mode switching circuit serves to detect change in potential at said impedance adjustment pad, when said impedance adjustment pad becomes electrically floating, and switch the operation ode of said semiconductor device to the test mode by halting the operation of said programmable impedance output buffer driver in response to the potential change of said impedance adjustment pad.

In accordance with another aspect of the present invention, a semiconductor device having a programmable impedance output port comprises:

a programmable impedance output buffer driver for adjusting the output impedance of said programmable impedance output port to an 1/n of the resistance value of an external resistor;

a mode switching circuit for switching the operation mode of said semiconductor device to a test mode by halting the operation of said programmable impedance output buffer driver in response to potential change of a mode control pad provided for the purpose of switching the operation mode; and an impedance fixing circuit for fixing, in the test mode, said output impedance of said programmable impedance output port to an fixed value irrespective of the impedance of said external resistor.

In accordance with a further aspect of the present invention, a semiconductor device having a programmable impedance output port and a JTAG port comprising:

a programmable impedance output buffer driver for adjusting the output impedance of said programmable impedance output port to an 1/n of the resistance value of an external resistor;

a mode switching circuit for switching the operation mode of said semiconductor device to a test mode by halting the operation of said programmable impedance output buffer driver in response to a JTAG command indicative of an instruction to enter the test mode of the programmable impedance output buffer circuit; and an impedance fixing circuit for fixing, in the test mode, said output impedance of said programmable impedance output port to an fixed value irrespective of the impedance of said external resistor.

Furthermore, in accordance with a preferred embodiment of the present invention, said programmable impedance output buffer driver is composed of an external impedance monitoring load circuit for applying a reference potential to said impedance adjustment pad, a dummy output buffer impedance of which is adjusted to the resistance value of said external resistor connected to said impedance adjustment pad, an impedance adjustment control circuit for generating adjustment data to adjust the impedance of said dummy output buffer to the resistance value of said external resistor, a data update control circuit for updating the impedance of said output buffer by transmitting said adjustment data as generated by said impedance adjustment control circuit to the output buffer, and a sampling clock generating circuit for generating sampling clocks based on which said impedance adjustment control circuit and said data update control circuit are operated in synchronism with each other in a certain timing.

Furthermore, in accordance with a preferred embodiment of the present invention, said impedance fixing circuit fixes, in the test mode, said output impedance of said programmable impedance output port to an fixed value in accordance with adjustment data as input through at least one pad which is not used in the normal mode of said semiconductor device.

Furthermore, in accordance with a preferred embodiment of the present invention, said impedance fixing circuit fixes, in the test mode, said output impedance of said programmable impedance output port to an fixed value in accordance with adjustment data as input through at least one extra pad which is provided for this purpose.

Furthermore, in accordance with a preferred embodiment of the present invention, said impedance fixing circuit fixes, in the test mode, said output impedance of said programmable impedance output port to an fixed value in accordance with adjustment data as generated within said programmable impedance output buffer driver.

Furthermore, in accordance with a preferred embodiment of the present invention, said semiconductor device further comprises a fixed data generation circuit which serves to generate said adjustment data.

Furthermore, in accordance with a preferred embodiment of the present invention, said impedance fixing circuit generate said adjustment data by the use of a potential available within said semiconductor device.

Furthermore, in accordance with a preferred embodiment of the present invention, said data update control circuit functions, in said test mode, also as said impedance fixing circuit in which said adjustment data is implemented and stored as hardwired connection within said data update control circuit.

Furthermore, in accordance with a preferred embodiment of the present invention, said impedance fixing circuit generates said adjustment data by the use of a logic of internal and/or external signals of said semiconductor device.

Also, the programmable impedance output buffer driver comprises a programmable impedance output buffer control circuit for adjusting the output impedance of said programmable impedance output port to an 1/n of the resistance value of an external resistor; a mode switching circuit for switching the operation mode of said semiconductor device to a test mode by halting the operation of said programmable impedance output buffer driver; and an impedance fixing circuit for fixing, in the test mode, said output impedance of said programmable impedance output port to an fixed value irrespective of the impedance of said external resistor.

Further, the static random access memory having a programmable impedance output port in accordance with the present invention comprises- a memory cell array for storing data; a row address buffer; a row address decoder for decoding the row address; a column address buffer; a column address decoder for decoding the row address; a sense amplifier for outputting data stored in a memory cell of said memory cell array as designated by said row address and said column address; and a programmable impedance output buffer driver for outputting data signal as amplified by said sense amplifier. The programmable impedance output buffer driver comprises a programmable impedance output buffer control circuit for adjusting the output impedance of said programmable impedance output port to an 1/n of the resistance value of an external resistor; a mode switching circuit for switching the operation mode of said semiconductor device to a test mode by halting the operation of said programmable impedance output buffer driver; and an impedance fixing circuit for fixing, in the test mode, said output impedance of said programmable impedance output port to an fixed value irrespective of the impedance of said external resistor.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings,, wherein.

DETAILED DESCRIPTION OF EMBODIMENTS

Figure 1:
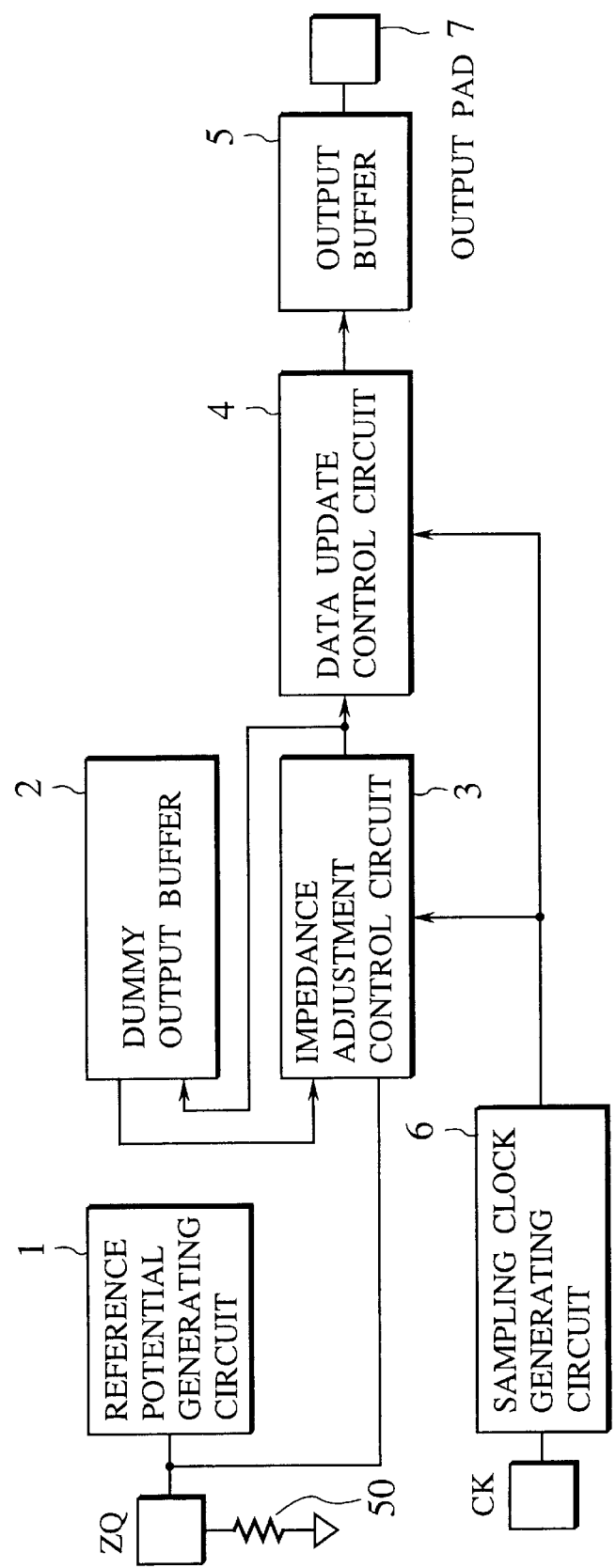
FIG. 1 is a block diagram showing the circuit configuration of the prior art programmable impedance output buffer driver.
Figure 2:
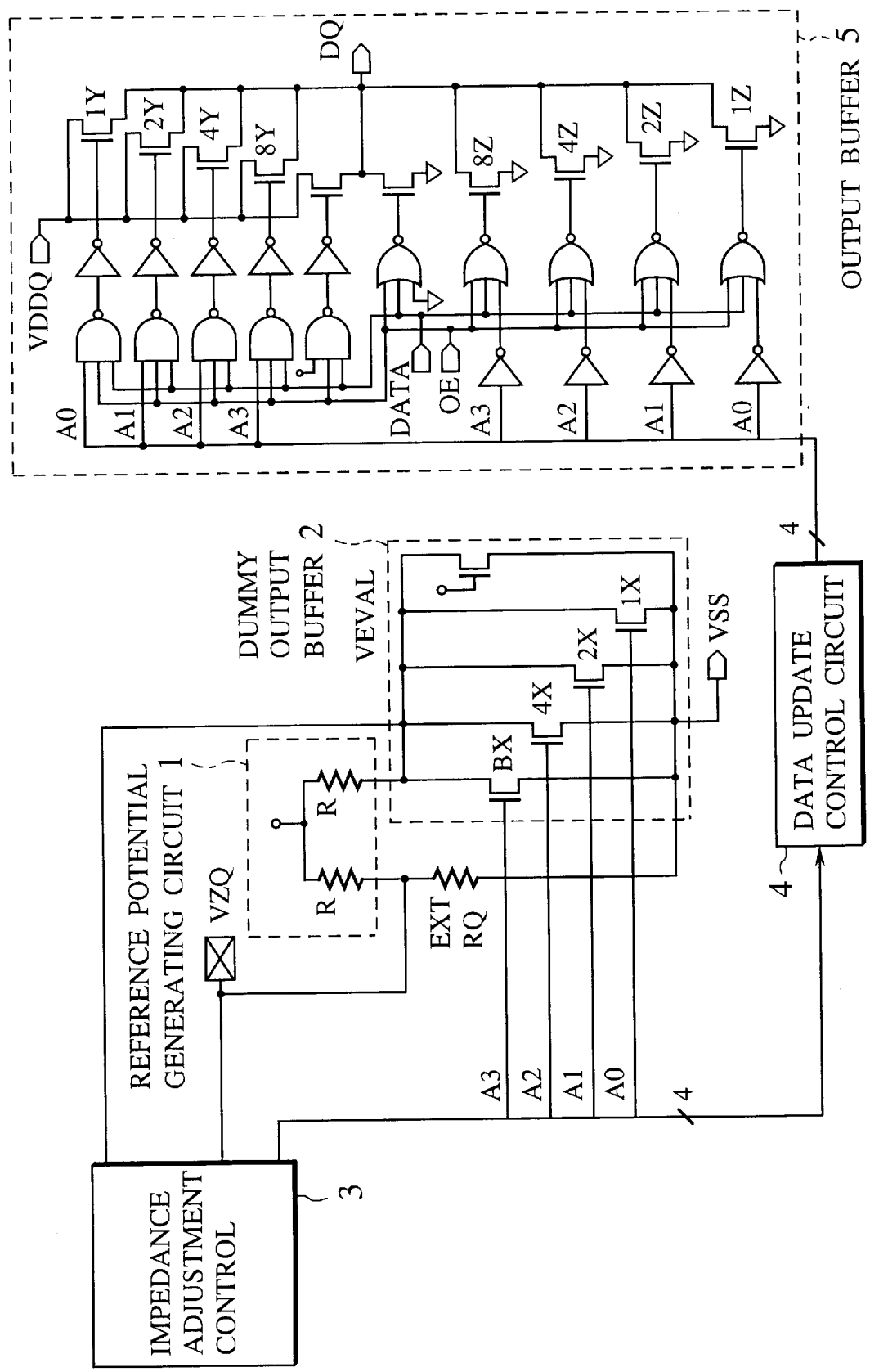
FIG. 2 is a block diagram showing the exemplary circuits of the external impedance monitoring load circuit, the dummy output buffer and the output buffer.
Figure 3:
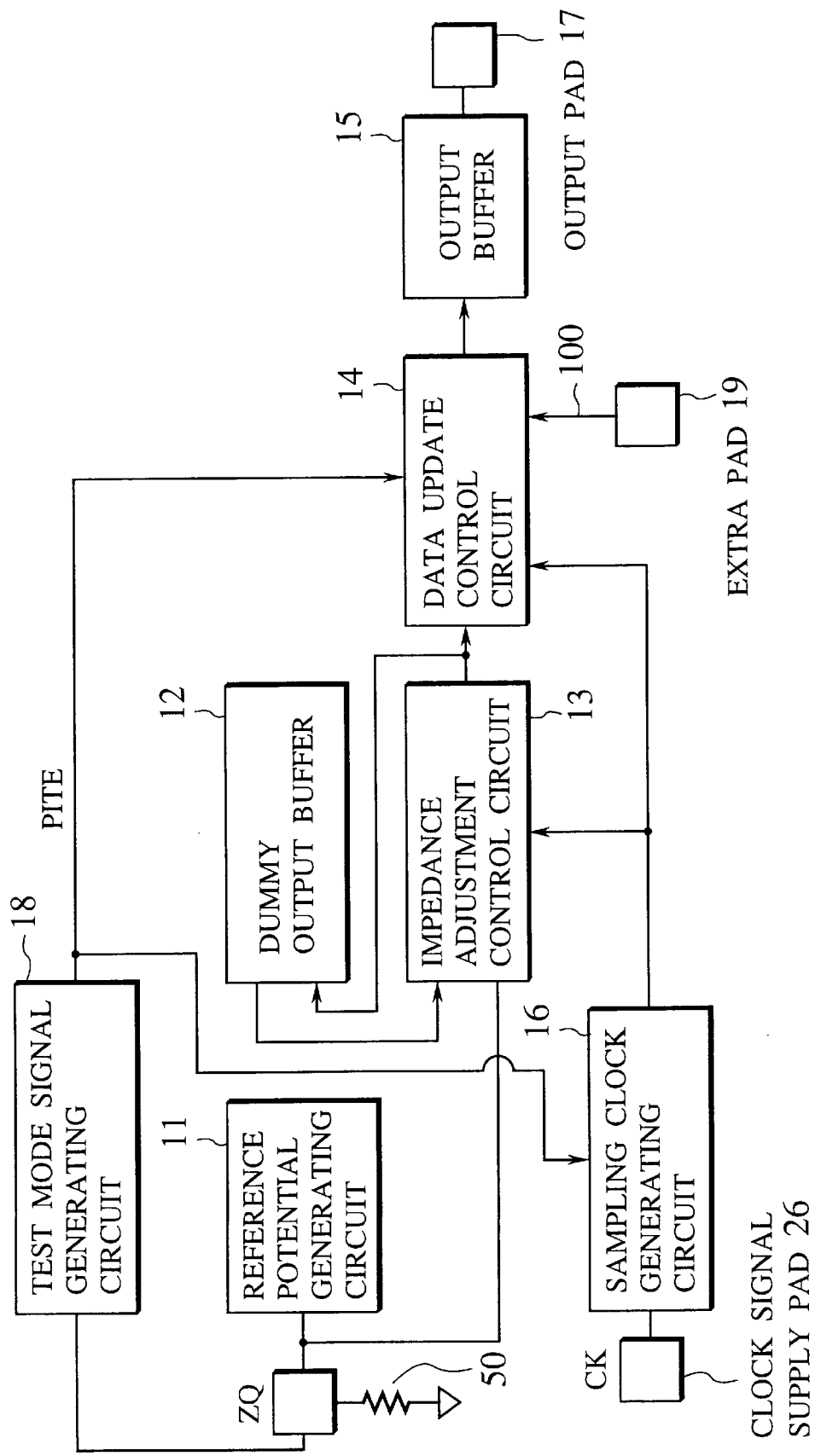
FIG. 3 is a block diagram showing a programmable impedance output buffer driver installed in the semiconductor device in accordance with a first embodiment of the present invention.

Hereinbelow, several preferred embodiments in accordance with the present invention will be explained in conjunction with the accompanied drawings. FIG. 3 is a block diagram showing a programmable impedance output buffer driver installed in the semiconductor device in accordance with a first embodiment of the present invention.

The programmable impedance output buffer driver is composed of an output buffer 15 to be adjusted to a constant impedance, i.e., an 1/n of the resistance value of an external resistor 50, an external impedance monitoring load circuit 11 for applying a reference potential to a ZQ pad, a dummy output buffer 12 whose impedance is adjusted to the resistance value of the external resistor 50 connected to the ZQ pad, an impedance adjustment control circuit 13 for conducting necessary control operation to adjust the impedance of the dummy output buffer 12 to the resistance value of the external resistor 50, a data update control circuit 14 for updating the impedance of the output buffer 15 by transmitting adjustment data of the impedance adjustment control circuit 13 to the output buffer 15, a sampling clock generating circuit 16 for generating sampling clocks based on which the impedance adjustment control circuit 13 and the data update control circuit 14 are operated in synchronism with each other in a certain timing, an output pad 17 through which data is output, a test mode signal generating circuit 18 for generating a PITE signal with which the operation mode of the programmable impedance output buffer driver is switched to the test mode, a clock signal supply pad for supplying an internal clock signal CK to the sampling clock generating circuit 16, and a plurality of extra pads 19 through which the adjustment data for use in the test mode. Typically, the number n is an integer, for example, five. While in this explanation the output buffer 15 as illustrated in the drawings outputs only one bit signal, a plurality of similar output buffers are provided in order to output multi-bits signals through a plurality of output pads as the output port of the semiconductor device.

Figure 4:
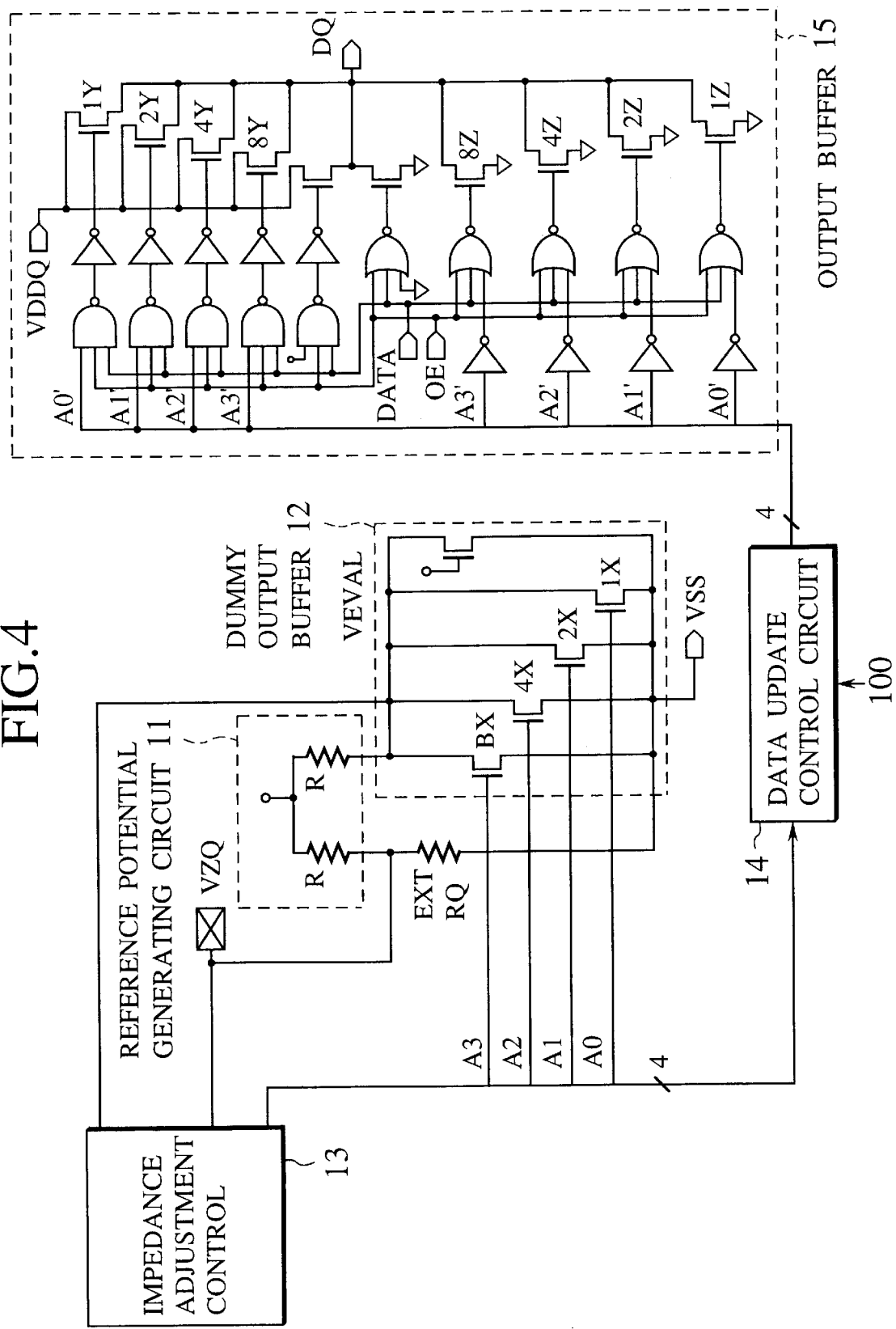
FIG. 4 is a block diagram showing the exemplary circuits of the external impedance monitoring load circuit, the dummy output buffer and the output buffer.

FIG. 4 is a block diagram showing the exemplary circuits of the external impedance monitoring load circuit 11, the dummy output buffer 12 and the output buffer 15.

The information of the resistance value RQ of the external resistor 50 is extracted as the potential level VZQ. In this case, the four bit signals A0, A1, A2 and A3 are adjusted with the high level "1" and the low level "0" in order to adjust the pad potential of the ZQ pad equal to the potential VEVAL so that the resistance value RQ of the external resistor 50 is made equal to the impedance of the dummy output buffer 12.

As described above, the impedance of the output buffer 15 of the programmable impedance output buffer driver is controlled to maintain the 1/n of the resistance value RQ of the external resistor 50 by updating the four bit signals A0, A1, A2 and A3 in a certain timing by means of the data update control circuit 14. Typically, the number n is an integer. In this case, the gate width of the transistors of the dummy output buffer 12 is selected to be, for instance, ⅕ of that of the transistors of the output buffer 15 and therefore, the resistance value RQ of the external resistor 50 is to be ⅕ of the resistance value to which the output buffer 15 is adjusted.

In the case that the programmable impedance output buffer driver is in the test mode, the data update control circuit 14 transmits a predetermined adjustment data 100 to the output buffer 15 rather than the adjustment data of the impedance adjustment control circuit 13, for updating the impedance of the output buffer 15.

Figure 5:
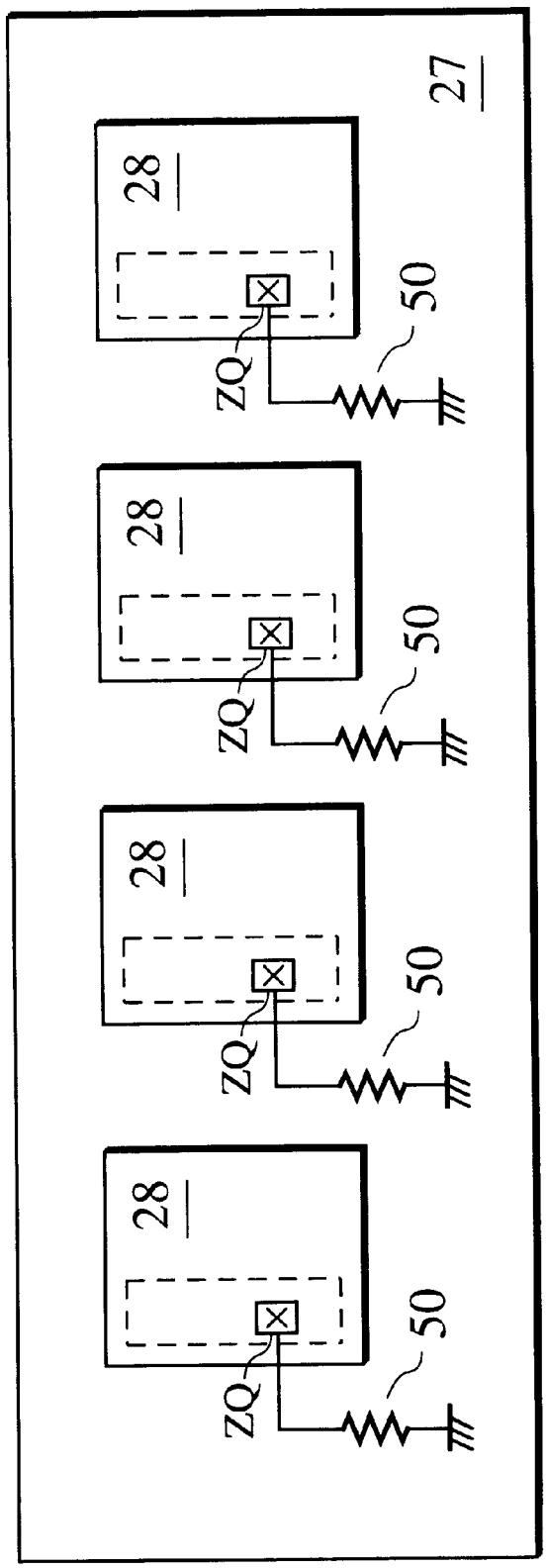
FIG. 5 is a schematic diagram showing an example of the implementation of the programmable impedance output buffer driver in accordance with the present invention.

FIG. 5 is a schematic diagram showing an example of the implementation of the programmable impedance output buffer driver in accordance with the present invention. In this case, a static random access memory (SRAM) module is composed of a plurality of semiconductor large-scale integrated circuit chips 28 mounted upon a printed circuit board. The output port of each semiconductor large-scale integrated circuit chip 28 is implemented with the programmable impedance output buffer driver as described above and as represented by the broken line in FIG. 5 in order to provide an external ZQ pad. The output impedance of each semiconductor large-scale integrated circuit chip 28 can be adjusted by connecting the external resistor 50 between each ZQ pad and the ground. By this configuration, it is possible to stabilize a high speed operation of the SRAM module even at extremely high frequencies, i.e., 200MHz or higher.

Figure 6:
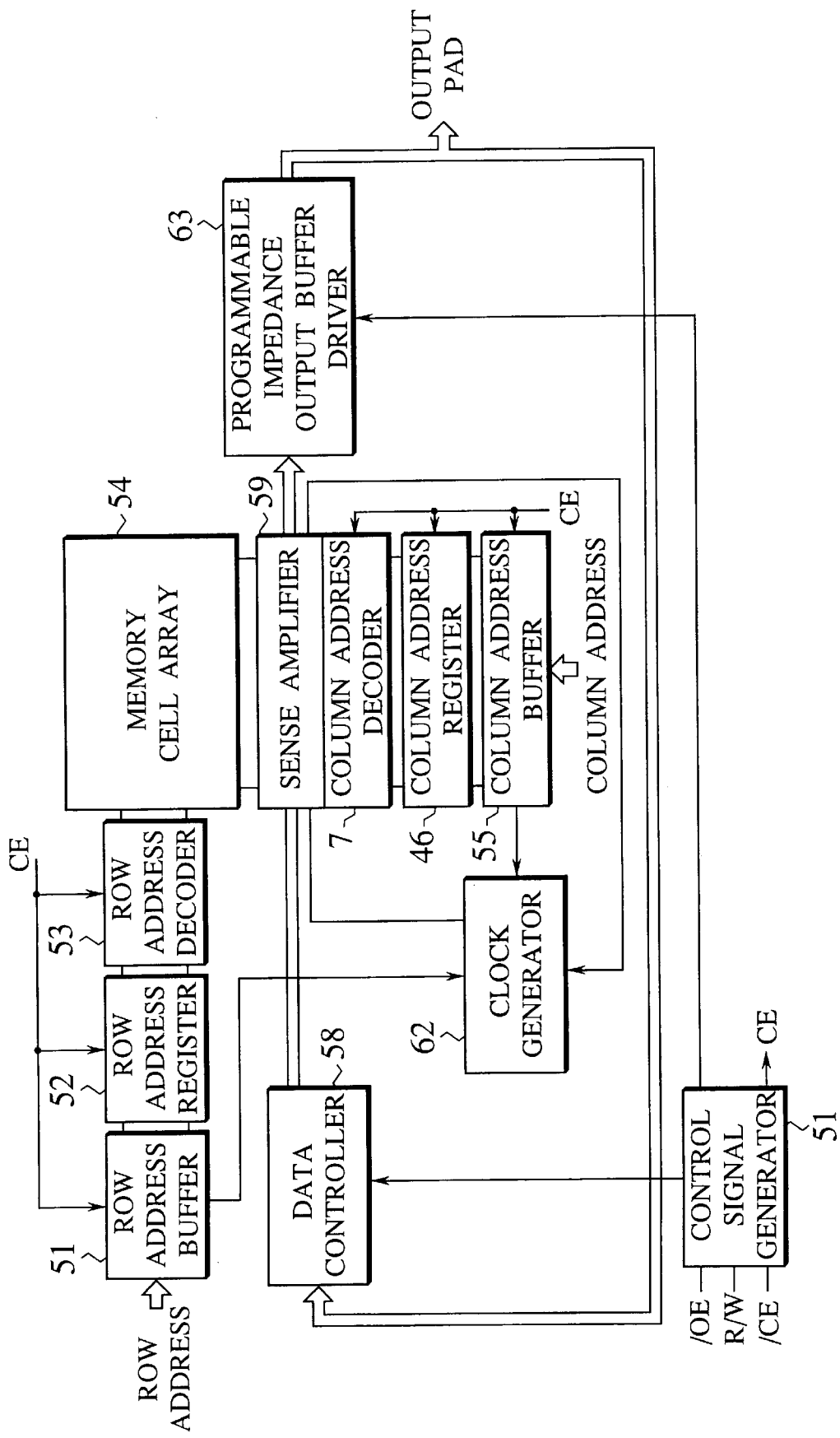
FIG. 6 is a block diagram showing an SRAM in the form of a semiconductor large-scale integrated circuit chip in accordance with the embodiment of the present invention.

FIG. 6 is a block diagram showing the SRAM 28 in the form of a semiconductor large-scale integrated circuit chip in accordance with the embodiment of the present invention.

The semiconductor large-scale integrated circuit chip 28 has a row address buffer 51 for receiving a row address, a row address register 52, and a row address decoder 53 for decoding the row address. These elements 51 to 53 are cascaded and connected to the rows of a memory cell array 54 for storing data. The semiconductor large-scale integrated circuit chip 28 further has a column address buffer 55 for receiving a column address, a column address register 56, and a column address decoder 57. These elements 55 to 57 are cascaded and connected to the columns of the memory cell array 54.

To write data into the memory cell array 54, a row address and column address are provided to specify a memory cell in the array 54, and data as input from output pads functioning also as input pads is written into the specified cell through a data controller 58, and a sense amplifier 59. To read data out of the memory cell array 54, a row address and a column address are provided to specify a memory cell in the array 54, and data in the specified cell is transferred to the output pad through the sense amplifier 59 and a programmable impedance output buffer driver 63 in accordance with the present invention.

A signal generator 61 generates a control signal for controlling the data controller 58 and a chip enable signal CE used to specify an address. A clock generator 62 generates a clock signal.

Figure 7:
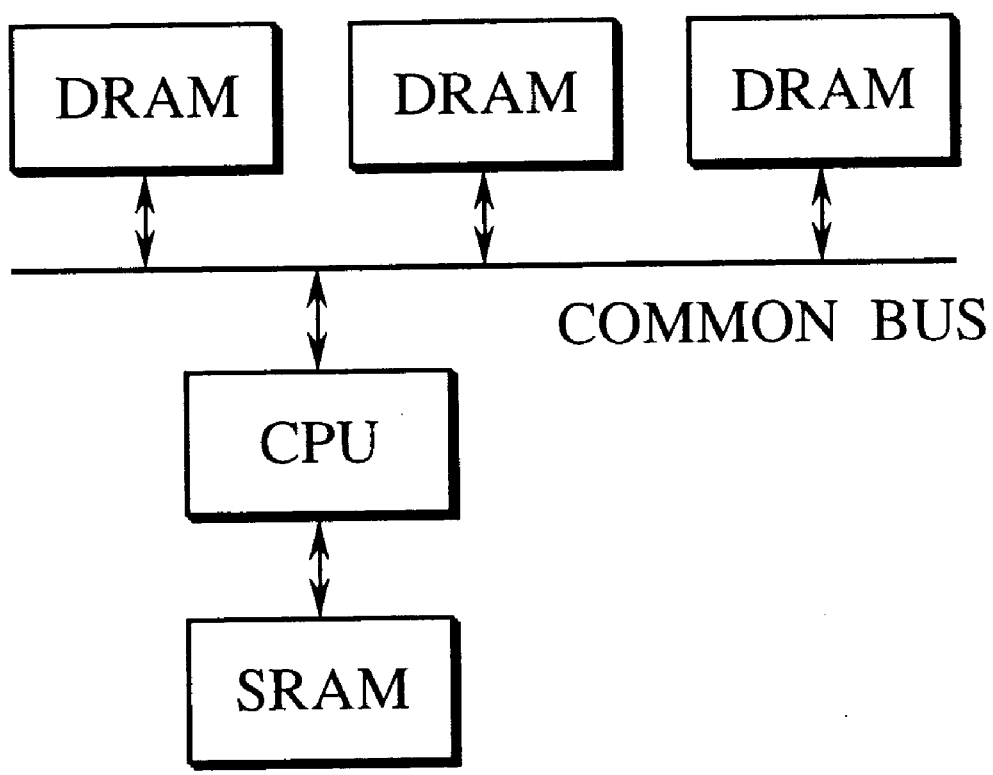
FIG. 7 is a circuit diagram showing an SRAM in the form of a semiconductor large-scale integrated circuit chip as connected to one of two data ports of a processor.

The programmable impedance output buffer driver in accordance with the present invention is possibly effective, when used in point-to-point connection, in order to further increase the operation speed. FIG. 7 is a circuit diagram showing the SRAM 28 in the form of a semiconductor large-scale integrated circuit chip as connected to one of two data ports of a processor. In this case, the programmable impedance output buffer driver in accordance with the present invention is formed also in said one of two data ports of the processor. The other of the two data ports of the processor is connected to a common bus o which a plurality of DRAMs are connected in parallel.

Next, the operation of this embodiment of the present invention will be explained. In the normal operation, the half reference potential (VDDQ/2) of the higher output potential (VDDQ) to be output from the programmable impedance output buffer, or an arbitrary appropriate potential within the tolerable vicinity thereof is applied to the ZQ pad while an external resistor 50 having the resistance value RQ is connected between the potential level VSS (e.g., the ground potential) and the ZQ pad. The voltage across the external resistor 50 is depending upon the resistance value of the external resistor 50. However, the external impedance monitoring load circuit 11 operates in order that the voltage across the external resistor 50 is depending upon the resistance value of the external resistor 50 becomes a half reference potential (VDDQ/2) of the higher power potential (VDDQ) as applied to the output buffer 15, or a potential within the tolerable vicinity thereof.

At this time, if the potential level of the ZQ pad is the half reference potential (VDDQ/2) of the higher power potential as applied to the output buffer 15, the mode control signal PITE is pulled down to the lower level so that the sampling clock generating circuit 16 is operated to supply the sampling clock signals to the impedance adjustment control circuit 13 and the data update control circuit 14 and let operating the impedance adjustment control circuit 13 and the data update control circuit 14.

When the external resistor 50 is connected to the ZQ pad and the ground potential, the impedance of the dummy output buffer 2 is adjusted to the impedance equal to the resistance value RQ of the external resistor 50 by means of the impedance adjustment control circuit 13. In this case, the impedance of the output buffer 15 is adjusted to a constant value, i.e., the 1/n of said external resistor 50 by sampling the adjustment data 100 in a certain timing and transferring the adjustment data to the output buffer 15 by means of the data update control circuit 14. By this configuration, the impedance of the output buffer 15 can be adjusted to an arbitrary value as externally selected corresponding to the resistance value of the external resistor 50 so that it is possible to adjust the impedance of the output buffer 5 to the impedance of the bus lines of the system bus and realize the high speed operation of the device.

Next, explanation will be made in the case of the evaluation of the operational speed of the device, upon which the programmable impedance output buffer driver is mounted, by switching the operation mode of the programmable impedance output buffer driver to the test mode thereof. In this case, the potential equivalent to the power potential VDD is applied to the ZQ pad.

By this configuration, the mode control signal PITE as generated by the test mode signal generating circuit 18 becomes high to halt the operation of the sampling clock generating circuit 16 and the normal operation of the impedance adjustment control circuit 13 and the data update control circuit 14. The external adjustment data 100 as input through the extra pads 19 provided for this purpose is transmitted to the output buffer 15 through said data update control circuit 14 in order to fix the impedance of the output buffer 15 to a certain value.

Namely, the extra pads 19 are given external four bit signals A0', A1', A2' and A3', i.e., the adjustment data 100 as explained above, in order to reset the output impedance of the output buffer 15 at the fixed value as predetermined by the external four bit signals. The number of the extra pads 19 corresponds to the number of bits of the adjustment data.

Figure 8:
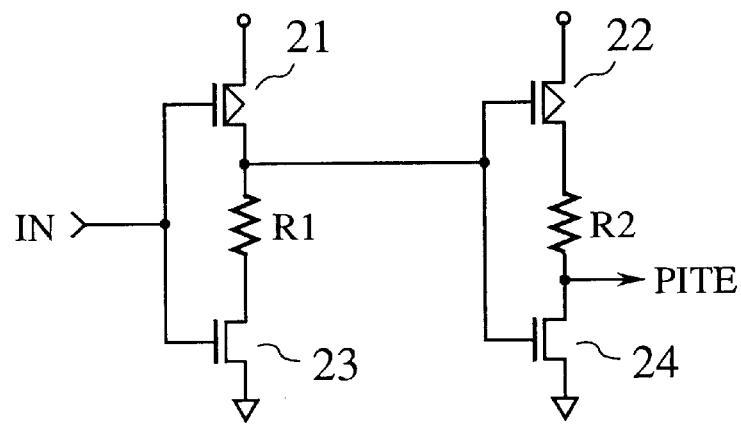
FIG. 8 is an exemplary circuit diagram showing the test mode signal generating circuit.

The operation of entering the test mode will be explained in details. FIG. 8 is an exemplary circuit diagram showing the test mode signal generating circuit 18. The test mode signal generating circuit 18 is composed of a pair of inverter circuits comprising p-type MOS transistors 21 and 22 and n-type MOS transistors 23 and 24. A resistor R1 having a relatively large resistance value is inserted between the p-type MOS transistor 21 and the n-type MOS transistor 23. Also, a resistor R2 having a relatively large resistance value is inserted between the p-type MOS transistor 22 and the n-type MOS transistor 24. However, the resistors R1 and R2 can be implemented by adjusting the dimension of MOS transistors as inserted in place of the resistors R1 and R2. Usually, the adjustment of the impedance is conducted with the ZQ pad, to which the potential level of VDDQ/2 is applied, by selecting the resistance value of the resistor R of the external impedance monitoring load circuit 11 as illustrated in FIG. 4.

In this case, VDDQ is the higher output level of the output buffer in the programmable impedance output buffer driver.

Because of this, in the normal mode of the programmable impedance output buffer driver, the potential of the ZQ pad, i.e., the gate potential of the p-type MOS transistor 21 and the n-type MOS transistor 23 becomes VDDQ/2 which is substantially lower than the power potential VDD so that the p-type MOS transistor 22 and the n-type MOS transistor 24 are turned on while the p-type MOS transistor 21 and the n-type MOS transistor 23 are turned off, resulting in the mode control signal PITE as the output being low.

Next, in the test mode of the programmable impedance output buffer driver with the ZQ pad given the full potential level of VDD, the gate potential of the p-type MOS transistor 21 and the n-type MOS transistor 23 becomes VDD so that the p-type MOS transistor 21 and the n-type MOS transistor 24 are turned off while the p-type MOS transistor 22 and the n-type MOS transistor 23 are turned on, resulting in the mode control signal PITE as the output being high.

Figure 9:
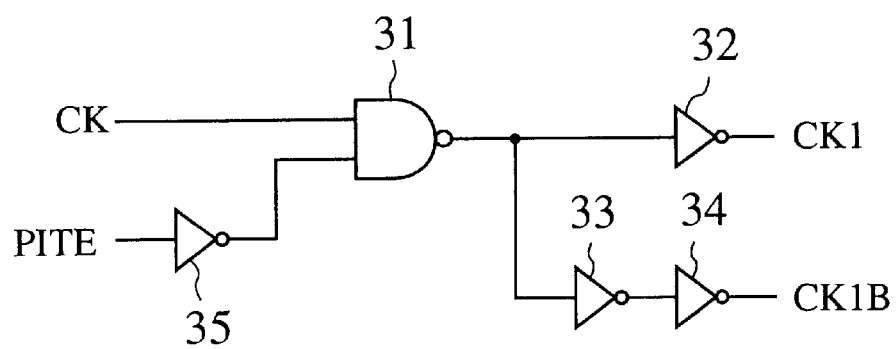
FIG. 9 is an exemplary circuit diagram showing the sampling clock generating circuit.

By the operation of as described above, in the normal mode, the mode control signal PITE is set low in order to turn off the test mode. Furthermore, the resistors R1 and R2 having a relatively large resistance value as inserted into the test mode signal generating circuit 18 make it possible to pull up the mode control signal PITE and enter the test mode of the programmable impedance output buffer driver simply by making floating the ZQ pad. FIG. 9 is an exemplary circuit diagram showing the sampling clock generating circuit 16. The sampling clock generating circuit 16 is composed of a NAND gate 31, inverters 32, 33 and 34 and an inverter 35 for providing a logic for generating the mode control signal PITE.

The mode control signal PITE as outputted from the test mode signal generating circuit 18 is inverted and is inputted to the NAND gate 31. By this configuration, when the mode control signal PITE is low (inactive) in the normal mode, the internal clock signal CK is passed through the NAND gate 31, which is conductive, and inputted to the inverter 32 and the inverter 33 for generating the sampling clock CK1 and the sampling clock CK1B with opposite phases. The registers of the data update control circuit 14 and the impedance adjustment control circuit 13 are opened/closed in synchronism with the sampling clock CK1 and the sampling clock CK1B.

Next, when the mode control signal PITE is high (active) in the test mode, the internal clock signal CK is not passed through the NAND gate 31, which is closed so that the sampling clock CK1 and the sampling clock CK1B are fixed respectively to low and high to halt the programmable impedance function.

Figure 10:
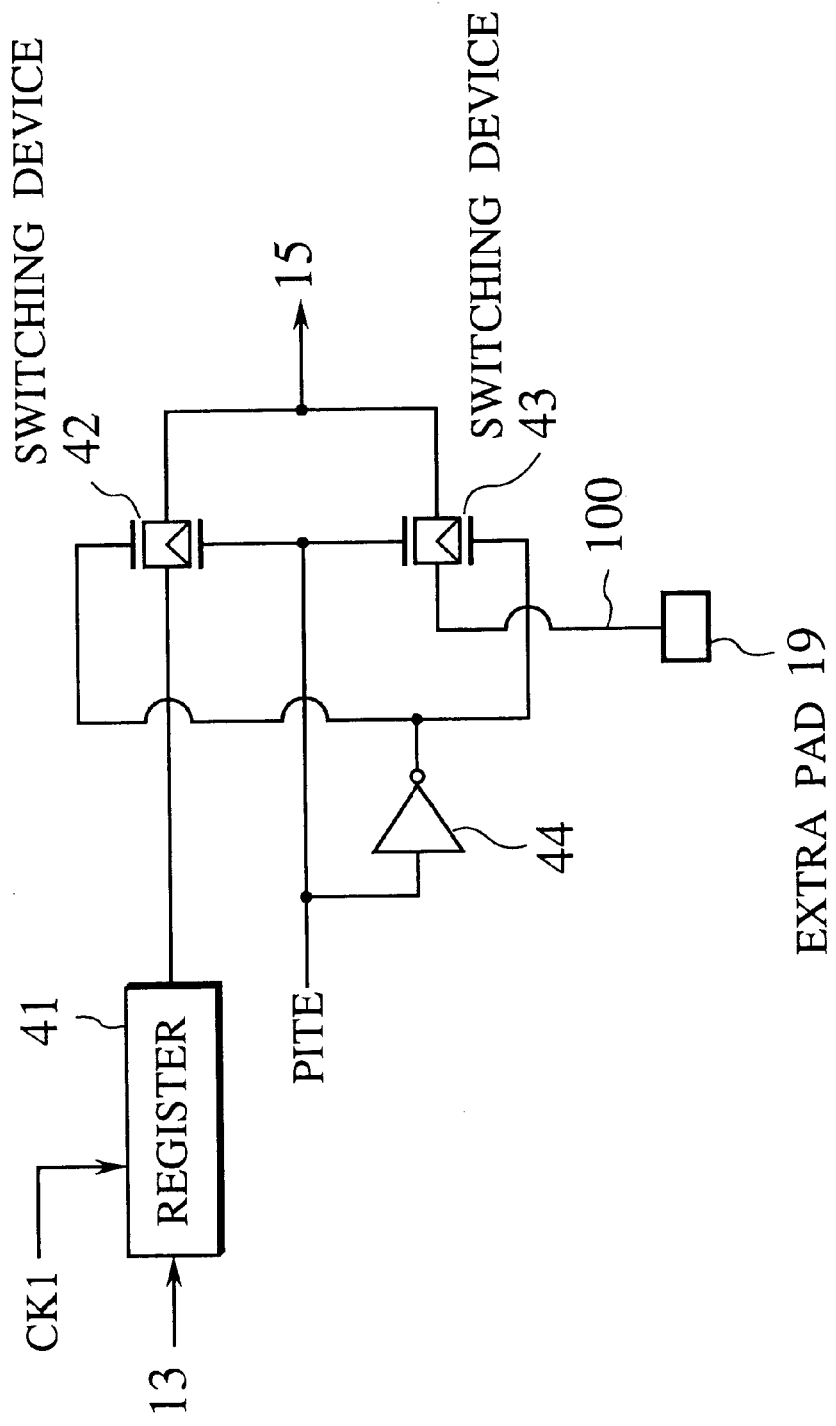
FIG. 10 is an exemplary partial circuit diagram showing the data update control circuit in which is illustrated a part for updating one of the four bits of the adjustment data.

FIG. 10 is an exemplary partial circuit diagram showing the data update control circuit 14 in which is illustrated a part for updating one of the four bits of the adjustment data. The data update control circuit 14 is composed of the switching elements 42 and 43 and the inverter 44, as contrast to the prior art case equipped only with the register 41. The register 41 serves to latch the adjustment data of the impedance adjustment control circuit 13 in synchronism with the clock signal CK1. The mode control signal PITE as output from the test mode signal generating circuit 18 is applied to one of the control terminals of each of the switching elements 42 and 43 while the inversion of the mode control signal PITE as output from the inverter 44 is applied to the other of the control terminals of each of the switching elements 42 and 43.

In this case, since the mode control signal PITE and the inversion of the mode control signal PITE are inputted respectively to the control terminals having opposite polarities of the switching elements 42 and 43, the switching element 42 is turned on while the switching element 43 is turned off when the mode control signal PITE is low (inactive) in the normal mode. By this configuration, the adjustment data of the register 41 is transferred to the output buffer 15 through the switching element 42.

Next, the switching element 42 is turned off while the switching element 43 is turned on. By this configuration, the adjustment data as input from the extra pads 19 is transferred to the output buffer 15 through the switching element 42 in place of the adjustment data of the register 41.

In accordance with this embodiment of the present invention, when the programmable impedance output buffer driver enters the test mode by applying a high potential to the ZQ pad to pull up the mode control signal PITE, the impedance of the output buffer 15 is adjusted to an arbitrary value corresponding to the adjustment data as input from the extra pads rather than that corresponding to the external resistor 50. Even if there is malfunction in the operation of the programmable impedance output buffer driver, it is possible to effectively and accurately conduct tests of the device such as evaluation of the operational speed of the device as equipped with the programmable impedance output buffer driver.

In the case of the embodiment as described above, the adjustment data 100 is input through the extra pads 19. This is convenient from the view point that different data 100 can be input in accordance with the actual case. However, extra input means is required for inputting the adjustment data 100. The present invention is not limited thereto.

Figure 11:
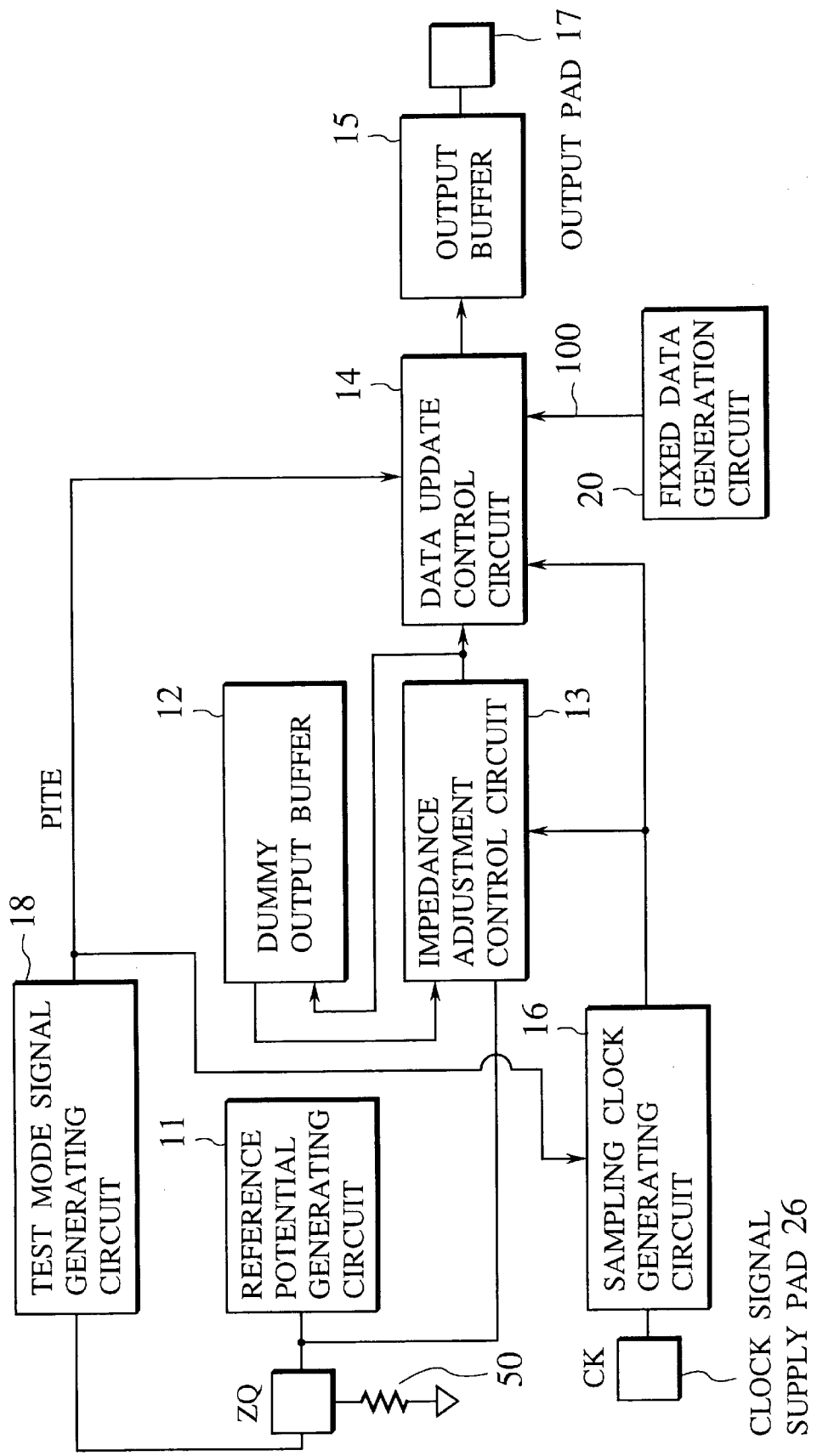
FIG. 11 is a schematic diagram showing a modification of an example of the implementation of the programmable impedance output buffer driver in accordance with the present invention as illustrated in FIG. 3.
Figure 12:
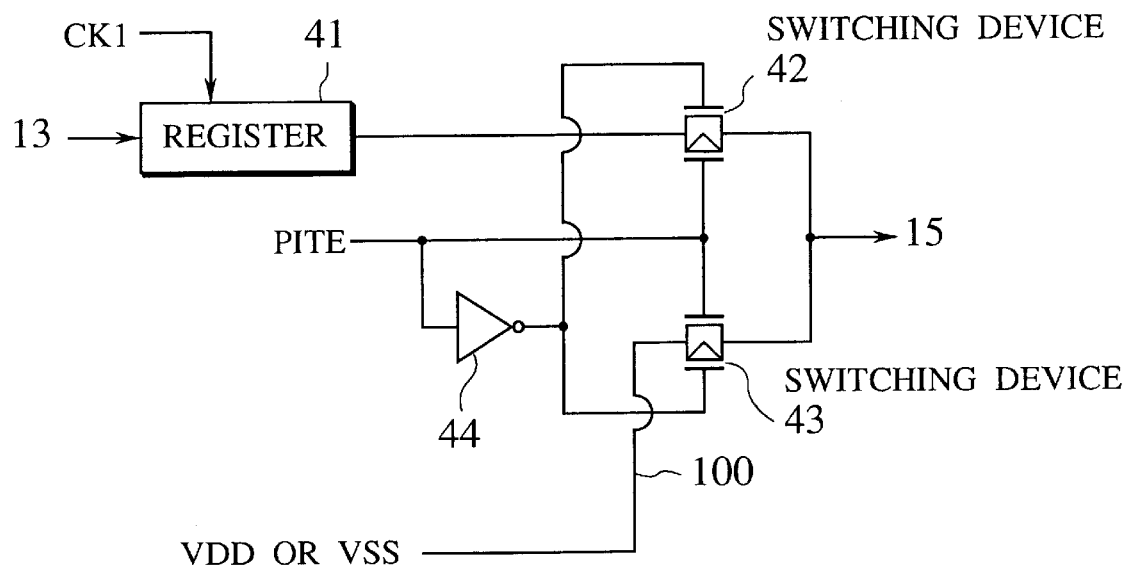
FIG. 12 is a schematic diagram showing an example of the fixed data generation circuit for use in the programmable impedance output buffer driver in accordance with the present invention.

FIG. 11 is a schematic diagram showing a modification of an example of the implementation of the programmable impedance output buffer driver in accordance with the present invention. In this case, the adjustment data 100 is supplied from a fixed data generation circuit 20 as illustrated in FIG. 12 implemented within the programmable impedance output buffer driver.

Alternatively, the data update control circuit can be designed in order to output hardwired data of the adjustment data implemented within the data update control circuit itself rather than the use of the fixed data generation circuit. For example, in order to generate the four bit signals A0', A1', A2' and A3' of (0001), the data update control circuit is designed to outputs "0" signals corresponding to the bit signals A0', A1' and A2' and outputs a "1" signal corresponding to the bit signal A3'.

Figure 13:
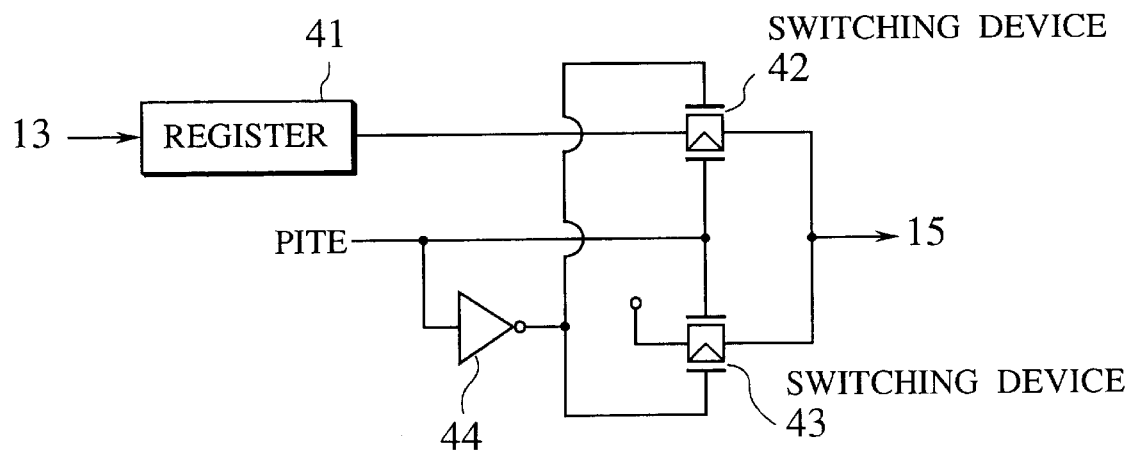
FIG. 13 is a partial circuit diagram showing the data update control circuit for outputting a "0" signal in the test mode of the programmable impedance output buffer driver.
Figure 14:
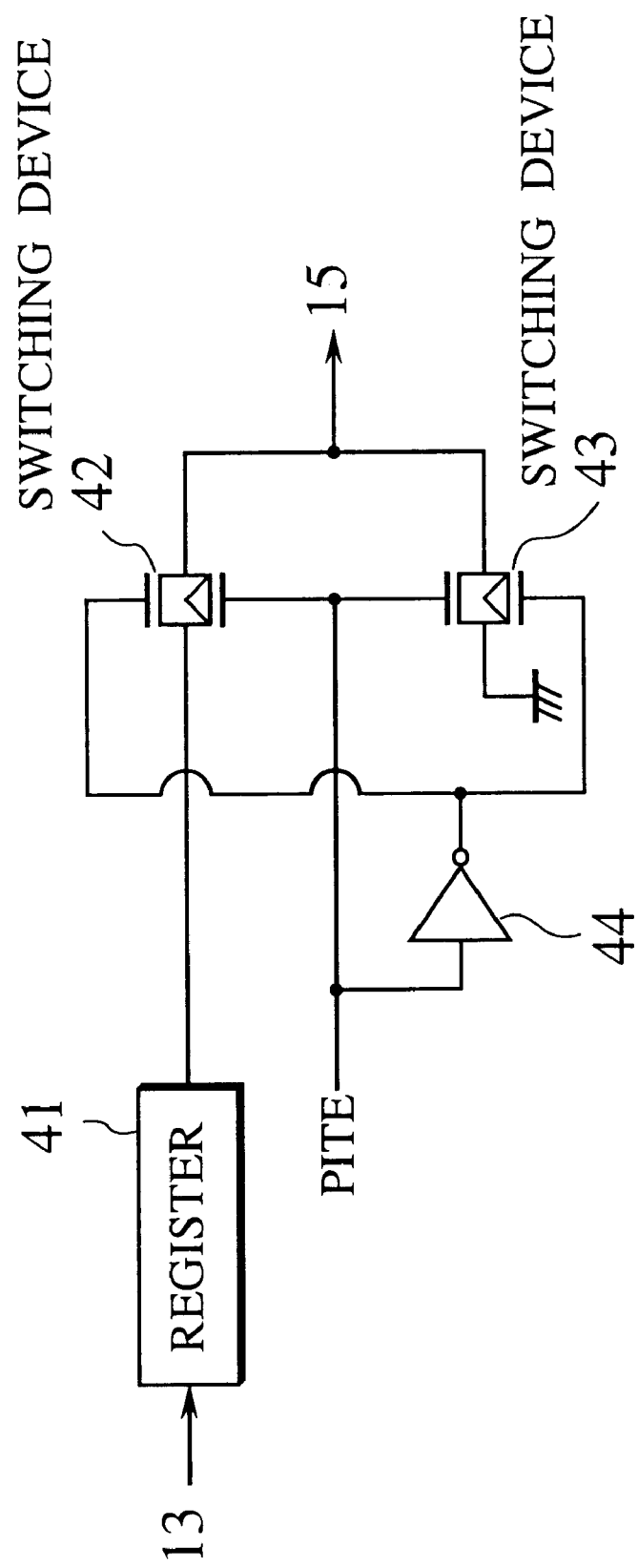
FIG. 14 is a partial circuit diagram showing the data update control circuit for outputting a "1" signal in the test mode of the programmable impedance output buffer driver.

FIG. 13 is a partial circuit diagram showing the data update control circuit for outputting a "0" signal in the test mode of the programmable impedance output buffer driver. In the figure, the low level signal is transferred to the output buffer 15 through the input terminal of the switching element 43 in the test mode in place of data as input from the extra pad 19. FIG. 14 is a partial circuit diagram showing the data update control circuit for outputting a "1" signal in the test mode of the programmable impedance output buffer driver. In the figure, the high level signal is transferred to the output buffer 15 through the input terminal of the switching element 43 in the test mode in place of data as input from the extra pad 19. In this case, the impedance of the output buffer 15 in the test mode can not be changed. However, the configuration of the programmable impedance output buffer driver can be simplified without a little increase of the circuit scale in spite of the provision of the test mode. Furthermore, there is no need for the extra pads which reqirue associated wiring arrangement so that the area of the pattern can be decreased.

Figure 15:
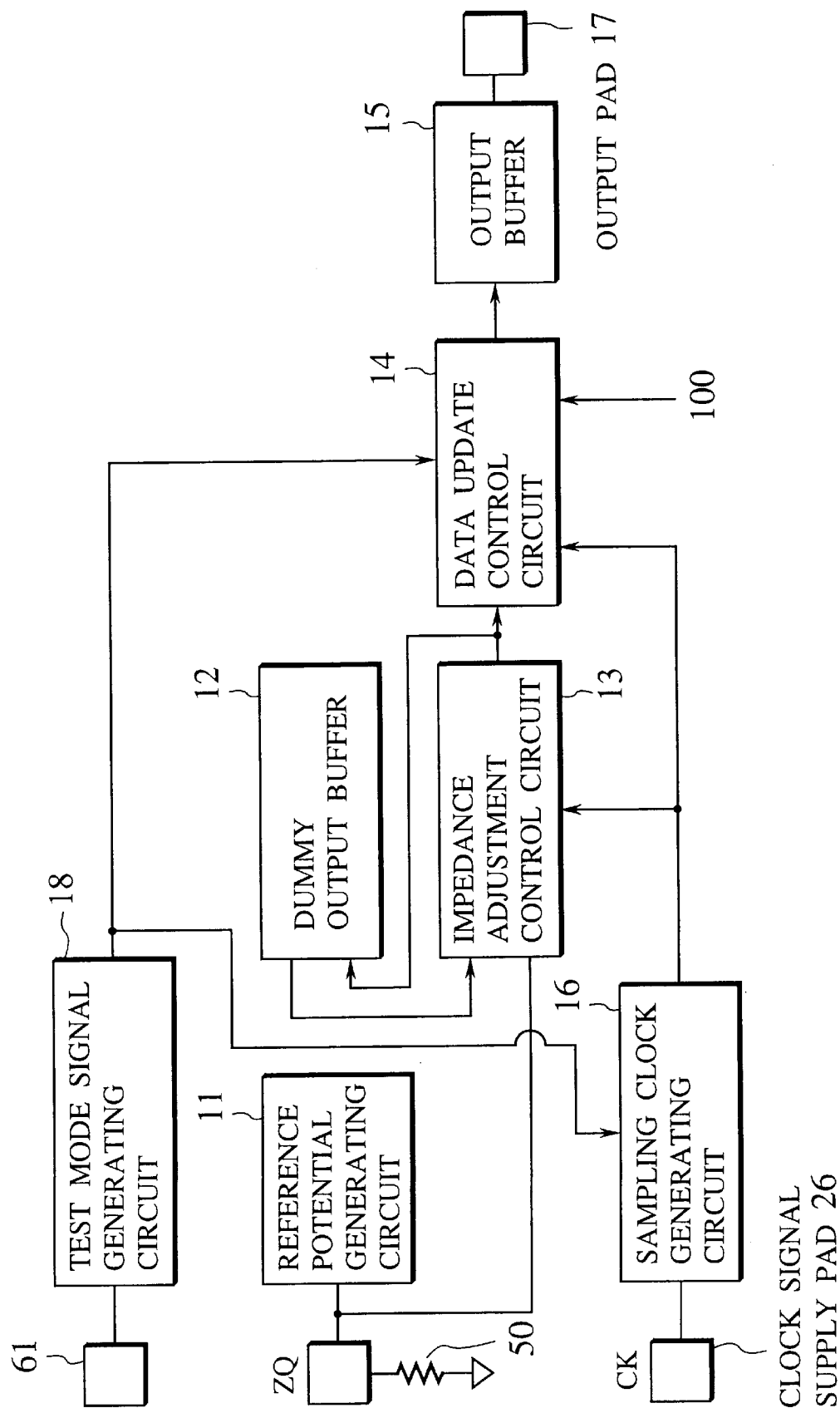
FIG. 15 is a block diagram showing a programmable impedance output buffer driver installed in the semiconductor device in accordance with a second embodiment of the present invention.
Figure 16:
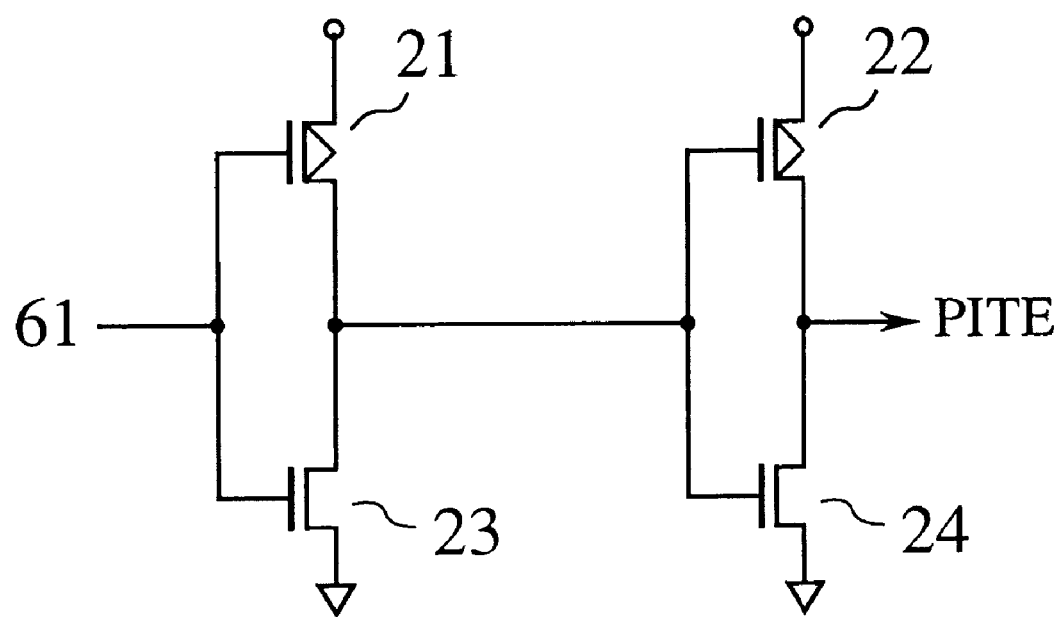
FIG. 16 is another exemplary circuit diagram showing the test mode signal generating circuit.

FIG. 15 is a block diagram showing a programmable impedance output buffer driver installed in the semiconductor device in accordance with a second embodiment of the present invention. In the drawing, like reference numbers indicate identical or functionally similar elements as the programmable impedance output buffer driver as illustrated in FIG. 3 and, and therefore redundant explanation is not repeated. In this embodiment of the present invention, the test mode signal generating circuit 18 is connected to an extra test mode control pad 61. The mode control signal PITE becomes low when the test mode control pad 61 is low in order to enable the normal operation of the programmable impedance output buffer driver, and becomes high when the test mode control pad 61 is high in order to enable the test operation of the programmable impedance output buffer driver. The test mode signal generating circuit 18 of this embodiment is provided with the test mode control pad 61, and therefore the test mode signal generating circuit can be designed without the resistors R1 and R2 having a relatively large resistance as illustrated in FIG. 16. While the other constituents elements have the same structures and functions of the previous embodiment, detailed explanation is not repeated.

Accordingly, also in this embodiment of the present invention, the impedance of the output buffer 15 is adjusted to a fixed value corresponding to the adjustment data 100 which can be input from the extra pads 19, the fixed data generation circuit 20 or internally generated from the data update control circuit 14 by a high level signal is input to the mode control signal in order to operate the programmable impedance output buffer driver in the test mode. The embodiment of the present invention has therefore same advantages as the previous embodiment.

Figure 17:
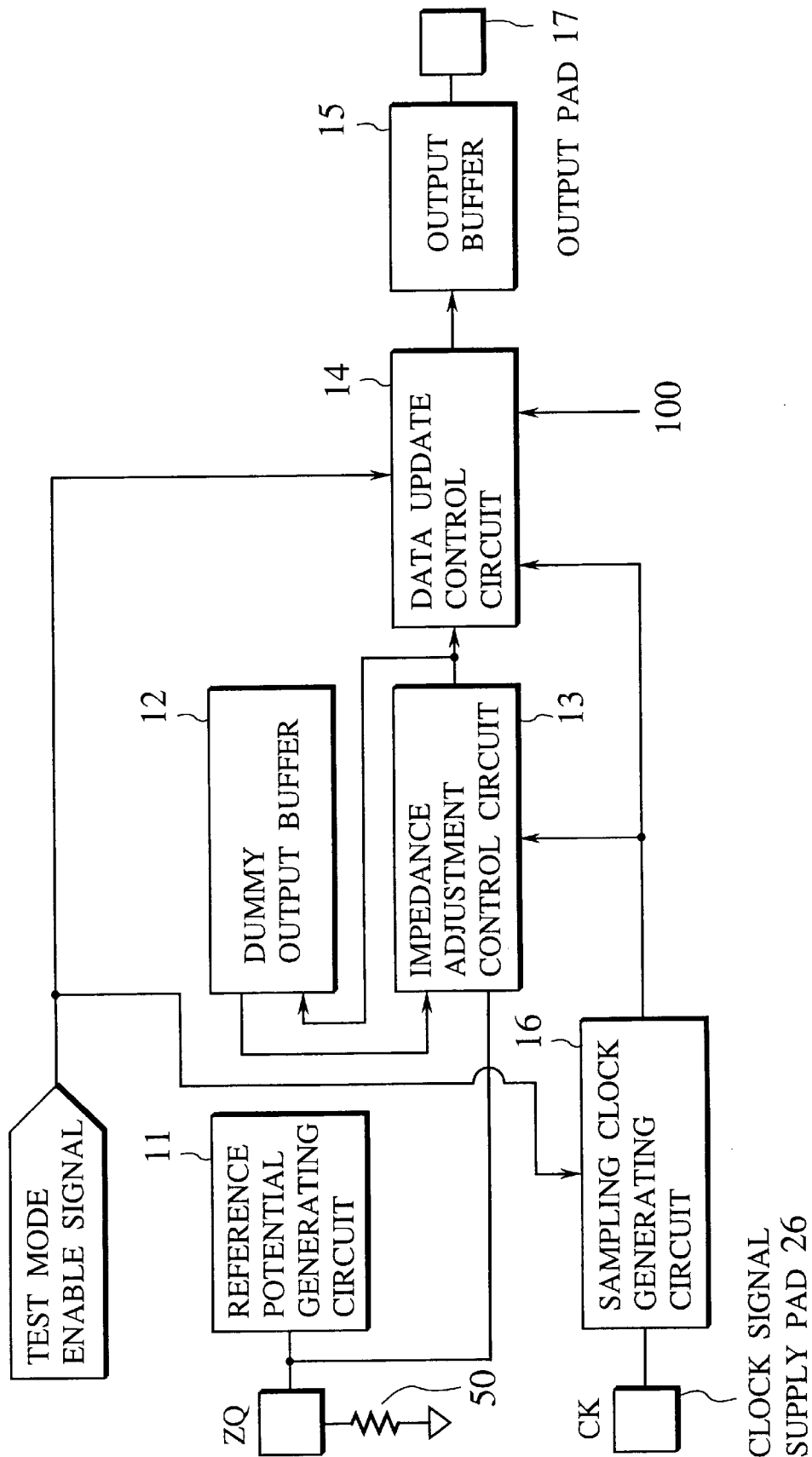
FIG. 17 is a block diagram showing a programmable impedance output buffer driver installed in the semiconductor device in accordance with a third embodiment of the present invention.

FIG. 17 is a block diagram showing a programmable impedance output buffer driver installed in the semiconductor device in accordance with a third embodiment of the present invention. Also in this case, like reference numbers indicate identical or functionally similar elements in the drawing as the programmable impedance output buffer driver as illustrated in FIG. 3 and, and therefore redundant explanation is not repeated.

In this embodiment of the present invention, the programmable impedance output buffer driver is applicable to a semiconductor device provided with a JTAG port and controlled to enter the test mode thereof by means of a JTAG controller. Namely, the test mode is enabled by providing an extra JTAG command (an extra command bit string) as introduced for this purpose indicative of an instruction to enter the test mode of the programmable impedance output buffer driver. When the extra JTAG command is given, the operation of the sampling clock generating circuit 16 is halted as well as the operation of the impedance adjustment control circuit 13 while the data update control circuit 14 is controlled to output predetermined data as explained above. The test mode is cleared by giving another extra JTAG command indicative of an instruction to enter the normal operation of the programmable impedance output buffer driver.

Accordingly, also in this embodiment of the present invention, the impedance of the output buffer 15 is adjusted to a fixed value corresponding to the adjustment data 100 which is input from the extra pads 19 or the fixed data generation circuit 20 or is internally generated from the data update control circuit 14 in the test mode. The embodiment of the present invention has therefore same advantages as the previous embodiments.

Alternatively, the adjustment data 100 can be input to the programmable impedance output buffer driver through a plurality of pads, e.g., JTAG pads, which are not used in the normal operation rather than the extra pads 19.

Figure 18:
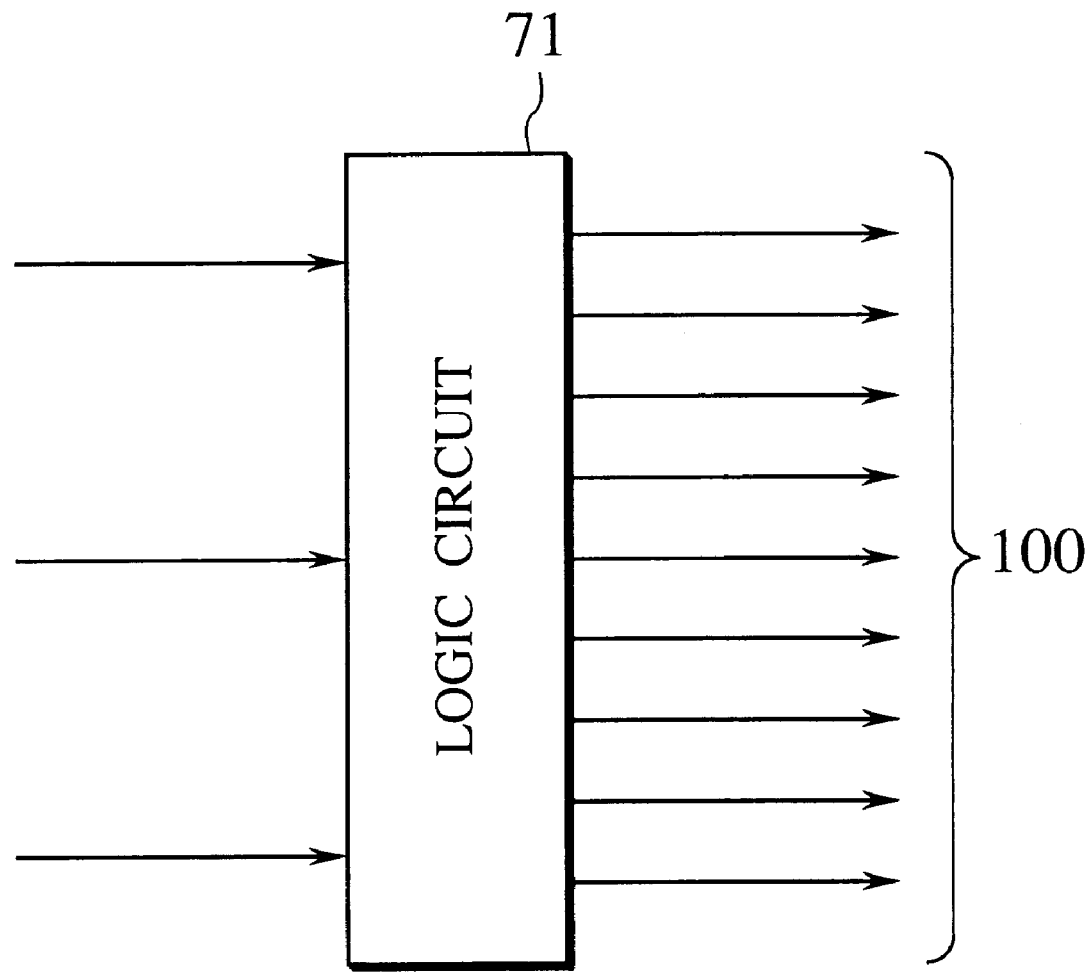
FIG. 18 is a schematic diagram showing another example of the fixed data generation circuit for use in the programmable impedance output buffer driver in accordance with the present invention.

Furthermore, the adjustment data 100 can be generated by means of a logic circuit 71 as illustrated in FIG. 18, which operates with a plurality of internal and/or external signals, and is input to the output buffer 15 through the data update control circuit 14 as fixed data.

While the test mode signal is generated by the test mode signal generating circuit in the above embodiments of the present invention, a test mode enable signal for testing another function than the programmable impedance output buffer driver can be make use of as the test mode signal instead.

As explained above, in accordance with the semiconductor device of the present invention, the impedance of the output buffer is adjusted to an arbitrary fixed value irrespective of the external resistor as connected so that it is possible to effectively and accurately conduct tests of the device such as evaluation of the operational speed of the device equipped with the programmable impedance output buffer driver.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A semiconductor device having a programmable impedance output port comprising:

a programmable impedance output buffer control circuit for adjusting the output impedance of said programmable impedance output port to an 1/n of the resistance value of an external resistor;

a mode switching circuit for switching the operation mode of said semiconductor device to a test mode by halting the operation of said programmable impedance output buffer control circuit in response to potential change of said impedance adjustment pad; and an impedance fixing circuit for fixing, in the test mode, said output impedance of said programmable impedance output port to an fixed value irrespective of the impedance of said external resistor.

2. The semiconductor device having a programmable impedance output port as claimed in claim 1, wherein said programmable impedance output buffer control circuit is composed of an external impedance monitoring load circuit for applying a reference potential to said impedance adjustment pad, a dummy output buffer impedance of which is adjusted to the resistance value of said external resistor connected to said impedance adjustment pad, an impedance adjustment control circuit for generating adjustment data to adjust the impedance of said dummy output buffer to the resistance value of said external resistor, a data update control circuit for updating the impedance of said output buffer by transmitting said adjustment data as generated by said impedance adjustment control circuit to the output buffer, and a sampling clock generating circuit for generating sampling clocks based on which said impedance adjustment control circuit and said data update control circuit are operated in synchronism with each other in a certain timing.

3. The semiconductor device having a programmable impedance output port as claimed in claim 1, wherein said mode switching circuit serves to detect change in potential at said impedance adjustment pad, when said impedance adjustment pad becomes electrically floating, and switch the operation mode of said semiconductor device to the test mode by halting the operation of said programmable impedance output buffer control circuit in response to the potential change of said impedance adjustment pad.

4. The semiconductor device having a programmable impedance output port as claimed in claim 1, wherein said impedance fixing circuit fixes, in the test mode, said output impedance of said programmable impedance output port to an fixed value in accordance with adjustment data as input through at least one pad which is not used in the normal mode of said semiconductor device.

5. The semiconductor device having a programmable impedance output port as claimed in claim 1, wherein said impedance fixing circuit fixes, in the test mode, said output impedance of said programmable impedance output port to an fixed value in accordance with adjustment data as input through at least one extra pad which is provided for this purpose.

6. The semiconductor device having a programmable impedance output port as claimed in claim 1, wherein said impedance fixing circuit fixes, in the test mode, said output impedance of said programmable impedance output port to an fixed value in accordance with adjustment data as generated within said programmable impedance output buffer control circuit.

7. The semiconductor device having a programmable impedance output port as claimed in claim 6, wherein said semiconductor device further comprises a fixed data generation circuit which serves to generate said adjustment data.

8. The semiconductor device having a programmable impedance output port as claimed in claim 6, wherein said impedance fixing circuit generate said adjustment data by the use of a potential available within said semiconductor device.

9. The semiconductor device having a programmable impedance output port as claimed in claim 6, wherein said data update control circuit functions, in said test mode, also as said impedance fixing circuit in which said adjustment data is implemented and stored as hardwired connection within said data update control circuit.

10. The semiconductor device having a programmable impedance output port as claimed in claim 6, wherein said impedance fixing circuit generates said adjustment data by the use of a logic of internal and/or external signals of said semiconductor device.

11. A semiconductor device having a programmable impedance output port comprising:
a programmable impedance output buffer control circuit for adjusting the output impedance of said programmable impedance output port to an 1/n of the resistance value of an external resistor;
a mode control pad provided for switching the operation mode;

a mode switching circuit for switching the operation mode of said semiconductor device to a test mode by halting the operation of said programmable impedance output buffer control circuit in response to potential change of the mode control pad provided for the purpose of switching the operation mode; and
an impedance fixing circuit for fixing, in the test mode, said output impedance of said programmable impedance output port to an fixed value irrespective of the impedance of said external resistor.

12. The semiconductor device having a programmable impedance output port as claimed in claim 11, wherein said programmable impedance output buffer control circuit is composed of an external impedance monitoring load circuit for applying a reference potential to said impedance adjustment pad, a dummy output buffer impedance of which is adjusted to the resistance value of said external resistor connected to said impedance adjustment pad, an impedance adjustment control circuit for generating adjustment data to adjust the impedance of said dummy output buffer to the resistance value of said external resistor, a data update control circuit for updating the impedance of said output buffer by transmitting said adjustment data as generated by said impedance adjustment control circuit to the output buffer, and a sampling clock generating circuit for generating sampling clocks based on which said impedance adjustment control circuit and said data update control circuit are operated in synchronism with each other in a certain timing.

13. The semiconductor device having a programmable impedance output port as claimed in claim 11, wherein said impedance fixing circuit fixes, in the test mode, said output impedance of said programmable impedance output port to an fixed value in accordance with adjustment data as input through at least one pad which is not used in the normal mode of said semiconductor device.

14. The semiconductor device having a programmable impedance output port as claimed in claim 11, wherein said impedance fixing circuit fixes, in the test mode, said output impedance of said programmable impedance output port to an fixed value in accordance with adjustment data as input through at least one extra pad which is provided for this purpose.

15. The semiconductor device having a programmable impedance output port as claimed in claim 11, wherein said impedance fixing circuit fixes, in the test mode, said output impedance of said programmable impedance output port to an fixed value in accordance with adjustment data as generated within said programmable impedance output buffer control circuit.

16. The semiconductor device having a programmable impedance output port as claimed in claim 15, wherein said semiconductor device further comprises a fixed data generation circuit which serves to generate said adjustment data.

17. The semiconductor device having a programmable impedance output port as claimed in claim 15, wherein said impedance fixing circuit generate said adjustment data by the use of a potential available within said semiconductor device.

18. The semiconductor device having a programmable impedance output port as claimed in claim 15, wherein said data update control circuit functions, in said test mode, also as said impedance fixing circuit in which said adjustment data is implemented and stored as hardwired connection within said data update control circuit.

19. The semiconductor device having a programmable impedance output port as claimed in claim 15, wherein said impedance fixing circuit generates said adjustment data by the use of a logic of internal and/or external signals of said semiconductor device.

20. A semiconductor device having a programmable impedance output port and a JTAG port comprising:
   a programmable impedance output buffer control circuit for adjusting the output impedance of said programmable impedance output port to an 1/n of the resistance value of an external resistor;
   a mode switching circuit for switching the operation mode of said semiconductor device to a test mode by halting the operation of said programmable impedance output buffer control circuit in response to a JTAG command indicative of an instruction to enter the test mode of the programmable impedance output buffer circuit; and
   an impedance fixing circuit for fixing, in the test mode, said output impedance of said programmable impedance output port to an fixed value irrespective of the impedance of said external resistor.

21. The semiconductor device having a programmable impedance output port as claimed in claim 20, wherein said programmable impedance output buffer control circuit is composed of an external impedance monitoring load circuit for applying a reference potential to said impedance adjustment pad, a dummy output buffer impedance of which is adjusted to the resistance value of said external resistor connected to said impedance adjustment pad, an impedance adjustment control circuit for generating adjustment data to adjust the impedance of said dummy output buffer to the resistance value of said external resistor, a data update control circuit for updating the impedance of said output buffer by transmitting said adjustment data as generated by said impedance adjustment control circuit to the output buffer, and a sampling clock generating circuit for generating sampling clocks based on which said impedance adjustment control circuit and said data update control circuit are operated in synchronism with each other in a certain timing.

22. The semiconductor device having a programmable impedance output port as claimed in claim 20, wherein said impedance fixing circuit fixes, in the test mode, said output impedance of said programmable impedance output port to an fixed value in accordance with adjustment data as input through at least one pad which is not used in the normal mode of said semiconductor device.

23. The semiconductor device having a programmable impedance output port as claimed in claim 20, wherein said impedance fixing circuit fixes, in the test mode, said output impedance of said programmable impedance output port to an fixed value in accordance with adjustment data as input through at least one extra pad which is provided for this purpose.

24. The semiconductor device having a programmable impedance output port as claimed in claim 20, wherein said impedance fixing circuit fixes, in the test mode, said output impedance of said programmable impedance output port to an fixed value in accordance with adjustment data as generated within said programmable impedance output buffer control circuit.

25. The semiconductor device having a programmable impedance output port as claimed in claim 24, wherein said semiconductor device further comprises a fixed data generation circuit which serves to generate said adjustment data.

26. The semiconductor device having a programmable impedance output port as claimed in claim 24, wherein said impedance fixing circuit generate said adjustment data by the use of a potential available within said semiconductor device.

27. The semiconductor device having a programmable impedance output port as claimed in claim 24, wherein said data update control circuit functions, in said test mode, also as said impedance fixing circuit in which said adjustment data is implemented and stored as hardwired connection within said data update control circuit.

28. The semiconductor device having a programmable impedance output port as claimed in claim 24, wherein said impedance fixing circuit generates said adjustment data by the use of a logic of internal and/or external signals of said semiconductor device.

29. A programmable impedance output buffer driver comprising:
   a programmable impedance output port;
   a programmable impedance output buffer control circuit for adjusting the output impedance of said programmable impedance output port to an 1/n of the resistance value of an external resistor;
   a mode switching circuit for switching the operation mode of said semiconductor device to a test mode by halting the operation of said programmable impedance output buffer driver; and
   an impedance fixing circuit for fixing, in the test mode, said output impedance of said programmable impedance output port to an fixed value irrespective of the impedance of said external resistor.

30. The programmable impedance output buffer driver as claimed in claim 29, wherein said mode switching circuit switches the operation mode of said semiconductor device to a test mode in response to a test mode enable signal for testing another function than the programmable impedance output buffer driver.

31. The programmable impedance output buffer driver as claimed in claim 29, wherein said mode switching circuit switches the operation mode of said semiconductor device to a test mode by halting the operation of said programmable impedance output buffer control circuit in response to potential change of said impedance adjustment pad.

32. The programmable impedance output buffer driver as claimed in claim 31, wherein said mode switching circuit serves to detect change in potential at said impedance adjustment pad, when said impedance adjustment pad becomes electrically floating, and switch the operation mode of said semiconductor device to the test mode by halting the operation of said programmable impedance output buffer control circuit in response to the potential change of said impedance adjustment pad.

33. The programmable impedance output buffer driver as claimed in claim 29, wherein said mode switching circuit switches the operation mode of said semiconductor device to a test mode by halting the operation of said programmable impedance output buffer control circuit in response to potential change of a mode control pad provided for the purpose of switching the operation mode.

34. The programmable impedance output buffer driver as claimed in claim 29, wherein said mode switching circuit switches the operation mode of said semiconductor device to a test mode by halting the operation of said programmable impedance output buffer control circuit in response to a JTAG command indicative of an instruction to enter the test mode of the programmable impedance output buffer circuit.

35. The programmable impedance output buffer driver as claimed in claim 29, wherein said programmable impedance output buffer control circuit is composed of an external impedance monitoring load circuit for applying a reference potential to said impedance adjustment pad, a dummy output buffer impedance of which is adjusted to the resistance value of said external resistor connected to said impedance adjustment pad, an impedance adjustment control circuit for generating adjustment data to adjust the impedance of said dummy output buffer to the resistance value of said external resistor, a data update control circuit for updating the impedance of said output buffer by transmitting said adjustment data as generated by said impedance adjustment control circuit to the output buffer, and a sampling clock generating circuit for generating sampling clocks based on which said impedance adjustment control circuit and said data update control circuit are operated in synchronism with each other in a certain timing.

36. The programmable impedance output buffer driver as claimed in claim 29, wherein said impedance fixing circuit fixes, in the test mode, said output impedance of said programmable impedance output port to an fixed value in accordance with adjustment data as input through at least one pad which is not used in the normal mode of said programmable impedance output buffer driver.

37. The programmable impedance output buffer driver as claimed in claim 29, wherein said impedance fixing circuit fixes, in the test mode, said output impedance of said programmable impedance output port to an fixed value in accordance with adjustment data as input through at least one extra pad which is provided for this purpose.

38. The programmable impedance output buffer driver as claimed in claim 29, wherein said impedance fixing circuit fixes, in the test mode, said output impedance of said programmable impedance output port to an fixed value in accordance with adjustment data as generated within said programmable impedance output buffer control circuit.

39. The programmable impedance output buffer driver as claimed in claim 38, wherein said programmable impedance output buffer driver further comprises a fixed data generation circuit which serves to generate said adjustment data.

40. The programmable impedance output buffer driver as claimed in claim 38, wherein said impedance fixing circuit generate said adjustment data by the use of a potential available within said programmable impedance output buffer driver.

41. The programmable impedance output buffer driver as claimed in claim 38, wherein said data update control circuit functions, in said test mode, also as said impedance fixing circuit in which said adjustment data is implemented and stored as hardwired connection within said data update control circuit.

42. The programmable impedance output buffer driver as claimed in claim 38, wherein said impedance fixing circuit generates said adjustment data by the use of a logic of internal and/or external signals of said programmable impedance output buffer driver.

43. A static random access memory having a programmable impedance output port comprising:

a memory cell array for storing data;

a row address buffer;

a row address decoder for decoding the row address;

a column address buffer;

a column address decoder for decoding the row address;

a sense amplifier for outputting data stored in a memory cell of said memory cell array as designated by said row address and said column address; and a programmable impedance output buffer driver for outputting data signal as amplified by said sense amplifier, said programmable impedance output buffer driver comprising:

a programmable impedance output buffer control circuit for adjusting the output impedance of said programmable impedance output port to an 1/n of the resistance value of an external resistor;

a mode switching circuit for switching the operation mode of said semiconductor device to a test mode by halting the operation of said programmable impedance output buffer driver; and an impedance fixing circuit for fixing, in the test mode, said output impedance of said programmable impedance output port to an fixed value irrespective of the impedance of said external resistor.

* * * * *